(12) United States Patent
Kusunoki et al.

(10) Patent No.: US 9,994,711 B2
(45) Date of Patent: Jun. 12, 2018

(54) CONDENSATION-CURABLE SILICONE COMPOSITION AND A SEMICONDUCTOR DEVICE

(71) Applicant: SHIN-ETSU CHEMICAL CO., LTD., Tokyo (JP)

(72) Inventors: Takayuki Kusunoki, Annaka (JP); Yuusuke Takamizawa, Annaka (JP); Tsutomu Kashiwagi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days. days.

(21) Appl. No.: 15/074,529

(22) Filed: Mar. 18, 2016

(65) Prior Publication Data
US 2016/0280959 A1 Sep. 29, 2016

(30) Foreign Application Priority Data

Mar. 24, 2015 (JP) .................. 2015-060906

(51) Int. Cl.
| | |
|---|---|
| *C08L 83/04* | (2006.01) |
| *H01L 33/56* | (2010.01) |
| *C08L 83/06* | (2006.01) |
| *C08G 77/16* | (2006.01) |
| *C08G 77/18* | (2006.01) |
| *C08G 77/00* | (2006.01) |

(52) U.S. Cl.
CPC .............. *C08L 83/04* (2013.01); *C08G 77/16* (2013.01); *C08G 77/18* (2013.01); *C08G 77/80* (2013.01); *C08L 83/06* (2013.01); *H01L 33/56* (2013.01)

(58) Field of Classification Search
CPC ...................................... C08L 83/06
See application file for complete search history.

(56) References Cited

U.S. PATENT DOCUMENTS

| | | | | |
|---|---|---|---|---|
| 3,271,360 | A | * | 9/1966 | Williams ............ C07F 7/12 525/474 |
| 3,361,714 | A | * | 1/1968 | Omietanski ......... C08G 77/04 528/24 |
| 6,417,310 | B1 | | 7/2002 | Omura et al. |
| 6,545,104 | B1 | * | 4/2003 | Mueller ............. C08L 83/04 524/588 |
| 2010/0273927 | A1 | | 10/2010 | Taguchi et al. |
| 2013/0225698 | A1 | * | 8/2013 | Watanabe ........... A61Q 19/00 514/772.3 |

FOREIGN PATENT DOCUMENTS

| | | |
|---|---|---|
| JP | 2000-351949 A | 12/2000 |
| JP | 2001-163981 A | 6/2001 |
| JP | 2002-348377 A | 12/2002 |
| JP | 2010-254825 A | 11/2010 |
| JP | 2012-111850 A | 6/2012 |
| JP | 2012-251058 A | 12/2012 |

* cited by examiner

*Primary Examiner* — Margaret G Moore
(74) *Attorney, Agent, or Firm* — Oliff PLC

(57) ABSTRACT

A condensation-curable silicone composition provides a cured product having good performance at a low temperature, excellent resistance to a temperature change, and a crack resistance, and a semiconductor device has a high reliability, whose semiconductor element is encapsulated with the cured product. A condensation-curable silicone composition has (A) a branched organopolysiloxane represented by formula (1-1) or (1-2) with a short branch made of 1 to 4 siloxane units and (C) a condensation catalyst in a catalytic amount. Further, a condensation-curable silicone composition also has (B) an organopolysiloxane having a network structure and represented by formula (2). Further, a semiconductor device is provided with a cured product obtained by curing the condensation-curable silicone composition.

15 Claims, No Drawings

CONDENSATION-CURABLE SILICONE COMPOSITION AND A SEMICONDUCTOR DEVICE

CROSS REFERENCE

This application claims the benefits of Japanese Patent Application No. 2015-60906 filed on Mar. 24, 2015, the contents of which are herein incorporated by reference.

FIELD OF THE INVENTION

The present invention relates to a condensation-curable silicone composition, a cured product thereof and a semiconductor device provided with the cured product. Specifically, the present invention relates to a condensation-curable silicone composition comprising a branched organopolysiloxane having a short siloxane branch.

Condensation-curable silicone resins have good heat resistance and light resistance, so that they have been used as materials for encapsulating semiconductor elements such as LEDs. For instance, Japanese Patent Application Laid-Open No. 2012-251058 describes a condensation-curable silicone resin which has good sulfurization resistance and is suitable to protect a silver surface in an internal bottom of an LED package. Japanese Patent Application Laid-Open No. 2012-111850 describes a condensation-curable silicone composition which has good adhesiveness to an adherend.

As mentioned above, condensation-curable silicone compositions are generally used as materials for encapsulating semiconductor elements, but their performances are not sufficient. Particularly, it is important for materials encapsulating LEDs to have crack resistance in addition to heat resistance and light resistance because the encapsulating materials are exposed to change of temperature or humidity of the atmosphere in addition to temperature change caused by switching an optical semiconductor device on and off, which all cause stress. However, the conventional condensation-curable silicone resins do not endure stress caused by temperature change so that their crack resistances are poor.

Japanese Patent Application Laid-Open No. 2002-348377 describes introduction of a branched structure into a linear silicone chain in order to improve a low-temperature property of a cured product and a method for preparing a branched organopolysiloxane by subjecting a mixture containing an organohydrogenpolysiloxane having a $CH_3(H)SiO_{1/2}$ unit to an equilibration reaction in the presence of an alkali catalyst and water. Japanese Patent Application Laid-Open No. 2001-163981 describes a branched organopolysiloxane prepared by polymerizing an alkoxy group-containing organopolysiloxane with a low-molecular weight organopolysiloxane in the presence of an acid or basic catalyst. However, these methods cannot separately control a length of the main chain and a length of the side chain. Therefore, the organopolysiloxane obtained might have a too long side chain or a network structure. Japanese Patent Application Laid-Open No. 2000-351949 describes a branched organopolysiloxane. Its side chain is too long and such an organopolysiloxane does not have sufficient resistance to temperature change.

PRIOR LITERATURES

Patent Literatures

[Patent Literature 1] Japanese Patent Application Laid-Open No. 2012-251058

[Patent Literature 2] Japanese Patent Application Laid-Open No. 2012-111850

[Patent Literature 3] Japanese Patent Application Laid-Open No. 2002-348377

[Patent Literature 4] Japanese Patent Application Laid-Open No. 2001-163981

[Patent Literature 5] Japanese Patent Application Laid-Open No. 2000-351949

DISCLOSURE OF THE INVENTION

Problems to be Solved by the Invention

One of the purposes of the present invention is to provide a condensation-curable silicone composition which provides a cured product having good performance at a low temperature, excellent resistance to a temperature change, and a crack resistance, and to provide a semiconductor device having a high reliability, whose semiconductor element is encapsulated with the cured product.

Means to Solve the Problems

To solve the aforesaid problems, the present inventors have made research and found that a product obtained by curing a condensation-curable silicone composition comprising a branched organopolysiloxane represented by the following formula (1-1) or (1-2) with a short branch consisting of 1 to 4 siloxane units, provides a semiconductor device having good performance at a low and high temperature, excellent resistance to a temperature change, and high reliability.

Thus, the present invention is to provide a condensation-curable silicone composition comprising the following components (A) and (C):

(A) a branched organopolysiloxane represented by the following formula (1-1) or (1-2);

(1-1)

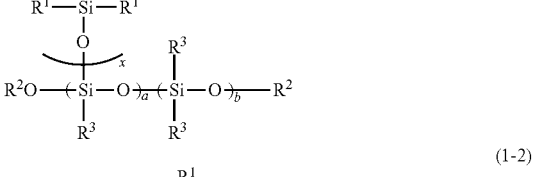

(1-2)

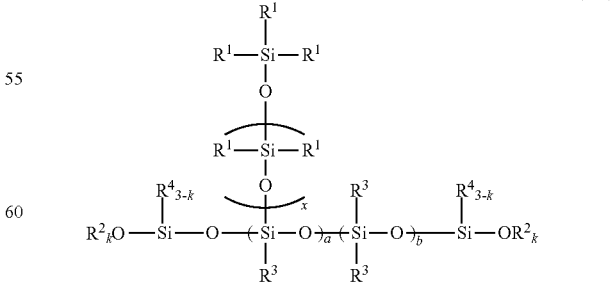

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^2$ is, independently of each other, a hydrogen atom or a saturated hydrocarbon group having 1 to 6 carbon atoms, $R^3$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^4$ is, independently of each other, a hydrogen atom, a substituted or unsubstituted, saturated hydrocarbon group having 1 to 6 carbon atoms or a substituted or unsubstituted, aromatic hydrocarbon group having 6 to 12 carbon atoms, x is an integer of from 0 to 3, a is an integer of from 1 to 100, b is an integer of from 0 to 300, and k is an integer of from 1 to 3, wherein the parenthesized siloxane units may form a block unit or bond randomly; and (C) a condensation catalyst in a catalytic amount.

Further, the present invention provides a semiconductor device provided with a cured product obtained by curing the condensation-curable silicone composition.

Effects of the Invention

The present condensation-curable silicone composition provides a cured product having a lower glass-transition temperature, compared to a composition comprising a linear organopolysiloxane which has a similar length of a molecular chain and a composition comprising an organopolysiloxane which has a long branch of, in particular, 5 or more siloxane units. The cured product has good performance at a low temperature, excellent resistance to a temperature change and improved crack resistance. Accordingly, the cured product of the present condensation-curable silicone composition is used for encapsulating semiconductor elements to thereby provide a semiconductor device having excellent reliability.

BEST MODE OF THE INVENTION

The present invention will be described below in detail.

(A) Branched Organopolysiloxane

The present composition is characteristic in that the composition comprises an organopolysiloxane which has a branch consisting of 1 to 4 siloxane units and is represented by the following formula (1-1) or (1-2):

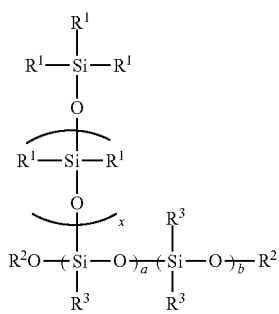

(1-1)

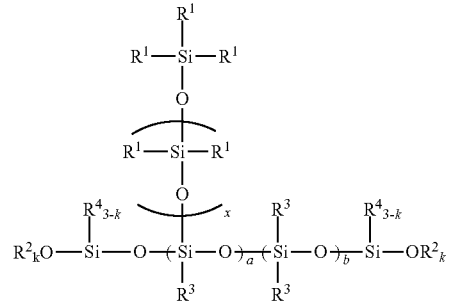

(1-2)

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^2$ is, independently of each other, a hydrogen atom or a saturated hydrocarbon group having 1 to 6 carbon atoms, $R^3$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^4$ is, independently of each other, a hydrogen atom, a substituted or unsubstituted, saturated hydrocarbon group having 1 to 6 carbon atoms or a substituted or unsubstituted, aromatic hydrocarbon group having 6 to 12 carbon atoms, x is an integer of from 0 to 3, a is an integer of from 1 to 100, b is an integer of from 0 to 300, and k is an integer of from 1 to 3, wherein the parenthesized siloxane units may form a block unit or bond randomly.

In the aforesaid formulas (1-1) and (1-2), $R^1$ is, independently of each other, a substituted or unsubstituted, saturated hydrocarbon group having 1 to 12 carbon atoms, preferably 1 to 8 carbon atoms or a substituted or unsubstituted, aromatic hydrocarbon group having 6 to 12 carbon atoms, preferably 6 to 10 carbon atoms. Examples of the substituted or unsubstituted, saturated hydrocarbon group include alkyl groups such as a methyl group, an ethyl group, a propyl group, a butyl group, and an octyl group, and cycloalkyl groups such as a cyclopentyl group and a cyclohexyl group; and those hydrocarbon groups wherein a part or all of the hydrogen atoms bonded, to the carbon atoms are substituted with a substituent such as a halogen atom such as a fluorine atom, a bromine atom and a chlorine atom, a cyano group, a glycidoxy group, a methacryloyloxy group, a mercapto group or an amino group, e.g., halogen-substituted monovalent hydrocarbon groups such as trifluoropropyl and chloropropyl groups, cyanoalkyl groups such as a β-cyanoethyl group and a γ-cyanopropyl group, 3-methacryloxypropyl group, 3-glycidyloxypropyl group, 3-mercaptopropyl group, and 3-aminopropyl group. Among these, a methyl group and a cyclohexyl group are preferred. A methyl group is more preferred. Examples of the substituted or unsubstituted, aromatic hydrocarbon group include aryl groups such as a phenyl group, a tolyl group and a naphthyl group, and aralkyl groups such as a benzyl group, a phenylethyl group and a phenylpropyl group; and those wherein a part or all of the hydrogen atoms bonded to the carbon atoms are substituted with a substituent such as a halogen atom such as a fluorine atom, a bromine atom and a chlorine atom, or a cyano group. Among these, a phenyl group and a tolyl group are preferred. A phenyl group is more preferred.

In the aforesaid formulas (1-1) and (1-2), $R^2$ is, independently of each other, a hydrogen atom or a saturated hydrocarbon group having 1 to 6 carbon atoms. Examples of the saturated hydrocarbon group include alkyl groups such as a methyl group, an ethyl group, a propyl group, an isopropyl group, an n-butyl group, an isobutyl group, a pentyl group, a hexyl group and a cyclohexyl group. Among these, a hydrogen atom, a methyl group, and an ethyl group are preferred in view of reactivity.

In the aforesaid formulas (1-1) and (1-2), $R^3$ is, independently of each other, a substituted or unsubstituted, saturated hydrocarbon group having 1 to 12 carbon atoms, preferably 1 to 8 carbon atoms or a substituted or unsubstituted, aromatic hydrocarbon group having 6 to 12 carbon atoms, preferably 6 to 10 carbon atoms. Examples of the saturated hydrocarbon group and the aromatic hydrocarbon group may be those groups defined for $R^1$. Among these, a methyl group and a phenyl group are preferred.

In the aforesaid formulas (1-1) and (1-2), $R^4$ is, independently of each other, a hydrogen atom, a substituted or unsubstituted, saturated hydrocarbon group having 1 to 6 carbon atoms or a substituted or unsubstituted, aromatic hydrocarbon group having 6 to 12 carbon atoms. Examples of the substituted or unsubstituted, saturated hydrocarbon group include alkyl groups such as a methyl group, an ethyl group, a propyl group, a butyl group, and an octyl group, and cycloalkyl groups such as a cyclopentyl group and a cyclohexyl group; and those wherein a part or all of the hydrogen atoms bonded to the carbon atoms are substituted with a substituent such as a halogen atom such as a fluorine atom, a bromine atom and a chlorine atom, a cyano group, a glycidoxy group, a methacryloyloxy group, a mercapto group or an amino group, e.g., halogen-substituted monovalent hydrocarbon groups such as a trifluoropropyl and chloropropyl groups, cyanoalkyl groups such as a β-cyanoethyl group and a γ-cyanopropyl group, 3-methacryloxypropyl group, 3-glycidyloxypropyl group, 3-mercaptopropyl group, and 3-aminopropyl group. Examples of the aromatic hydrocarbon group include aryl groups such as a phenyl group, a tolyl group and a naphthyl group, and aralkyl groups such as a benzyl group, a phenylethyl group and a phenylpropyl group; and a phenyl group is preferred. Among these, a hydrogen atom, a methyl group and a phenyl group are preferred.

In the aforesaid formulas (1-1) and (1-2), x is an integer of from 0 to 3, preferably 0 or 1, in particular 0. a is an integer of from 1 to 100, preferably an integer of from 1 to 75, further preferably an integer of from 1 to 50. b is an integer of from 0 to 300, preferably an integer of from 0 to 250, further preferably 0 to 150, provided that a total of a and b is 1 to 400, preferably 3 to 300, further preferably 5 to 200. The value of a/(a+b) is preferably 0.01 to 1.0.

In the aforesaid formulas (1-2), k is an integer of from 1 to 3, preferably 2 or 3, further preferably 3.

In the aforesaid branched organopolysiloxane, at least one of the groups represented by $R^1$ is preferably an aromatic hydrocarbon group. In particular, the branched organopolysiloxane has a monovalent aromatic hydrocarbon group bonded to a silicon atom, in an amount of preferably 3% or more in number, further preferably 5% or more in number, based on a total number of the groups each bonded to a silicon atom. The upper limit is preferably 80% or less in number. When the branched organopolysiloxane has the aromatic hydrocarbon group in the aforesaid amount, a cured product obtained has a higher refraction index and a lower gas permeability, so that the composition is suitable for encapsulating semiconductor elements.

A method for preparing the aforesaid branched organopolysiloxanes (1-1) and (1-2) will be described below.

The branched organopolysiloxane may be prepared in a method characterized in that an organosiloxane which is represented by the following formula (3) and has two hydrolyzable groups bonded to a silicon atom at one terminal is adopted as a stating material for the introduction of a branch and is subjected to a condensation reaction. The condensation reaction is preferably carried out in the presence of a catalyst.

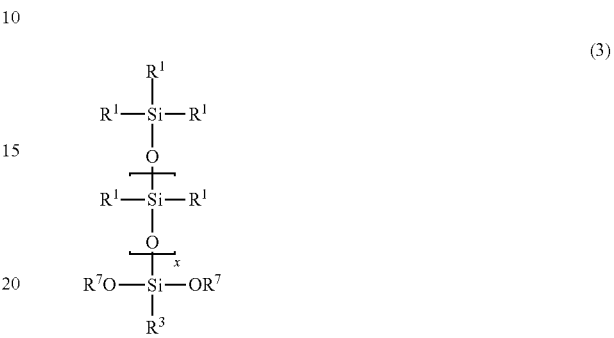

(3)

wherein $R^1$, $R^3$ and x are as defined above, and $R^7$ is a hydrogen atom or a saturated hydrocarbon group having 1 to 6 carbon atoms.

In the aforesaid formula (3), $R^7$ is, for instance, alkyl groups such as a methyl group, an ethyl group, a propyl group, a butyl group, a isopropyl group, a hexyl group and a cyclohexyl group. Among these, a methyl group and an ethyl group are preferred. A methyl group is preferred.

Examples of the organopolysiloxane represented by the formula (3) include 1,1,1,3-tetramethyl-3,3-dimethoxydisiloxane, 1-phenyl-1,1,3-trimethyl-3,3-dimethoxydisiloxane, 1,1-diphenyl-1,3-dimethyl-3,3-dimethoxydisiloxane, 1,1-diphenyl-1,3-dimethyl-3,3-diethoxydisiloxane, 1,1,1-triphenyl-3-methyl-3,3-dimethoxydisiloxane, 1,1,1-trimethyl-3-phenyl-3,3-dimethoxydisiloxane, 1,3-diphenyl-1,1-dimethyl-3,3-dimethoxydisiloxane, 1,1-diphenyl-1-methyl-3-phenyl-3,3-dimethoxydisiloxane, 1,1,1-triphenyl-3-phenyl-3,3-dimethoxydisiloxane, 1,1-diphenyl-1-methyl-3-cyclohexyl-3,3-dimethoxydisiloxane, 1,1-diphenyl-1-methyl-3-glycidyloxypropyl-3,3-dimethoxydisiloxane, 1,1-diphenyl-1-methyl-3-trifluoropropyl-3,3-dimethoxydisiloxane, 1,1,1,3,3,5-hexamethyl-5,5-dimethoxytrisiloxane, 1,1-diphenyl-1,3,3,5-tetramethyl-5,5-dimethoxytrisiloxane, 1,1,1-triphenyl-3,3,5-trimethyl-5,5-dimethoxytrisiloxane, 1,1,1,3,3-pentamethyl-5-phenyl-5,5-dimethoxytrisiloxane, 1,1,5-tripheny-1,3,3-trimethyl-5,5-dimethoxytrisiloxane, 1,1,1,5-tetraphenyl-3,3-trimethyl-5,5-dimethoxytrisiloxane, 1,1,1,5-tetramethyl-3,3-diphenyl-5,5-dimethoxytrisiloxane, 1,1,1-trimethyl-3,3,5-triphenyl-5,5-dimethoxytrisiloxane, 1,1,1,3,3,5-hexaphenyl-5,5-dimethoxytrisiloxane, 1,1-diphenyl-1-methyl-3-vinyl-3,3-dimethoxydisiloxane, 1,1-diphenyl-1-methyl-3,3-dimethoxydisiloxane, 1,1-diphenyl-1-methyl-3,3-diphenyl-5-methyl-5,5-dimethoxytrisilo xane, 1,1-diphenyl-1-methyl-3,5,7-triphenyl-3,5,7-trimethyl-9-methyl-9,9-dimethoxypentasiloxane, 1,1-diphenyl-1-methyl-3,5,7-tri(3,3-trifluoropropyl)-3,5,7-tri methyl-9-methyl-9,9-dimethoxypentasiloxane, and 1,1-diphenyl-1-methyl-3-(3,3,3-trifluoropropyl)-3,3-dimethoxydisiloxane.

The compound represented by the formula (3) is condensation reacted by itself or with another organic silicon compound, preferably in the presence of a catalyst, to prepare the organopolysiloxane represented by the aforesaid formula (1-1).

Examples of the other silicon compound include chlorosilanes such as dimethyldichlorosilane, methylvinyldichlorosilane, phenylmethyldichlorosilane, diphenyldichlorosilane, and diethyldichlorosilane and cyclohexylmethyldichlorosilane; alkoxysilanes such as dimethyldimethoxysiloxane, methylphenyldimethoxysiloxane, diphenyldimethoxysiloxane, benzylmethyldimethoxysiloxane, dimethyldiethoxysiloxane, methylphenyldiethoxysiloxane, diphenyldiethoxysiloxane and benzylmethyldiethoxysilane; disilanols such as diphenylsilanediol, benzylmethylsilanediol and dibenzylsilanediol; and silanes having a hydrocarbon group having a halogen, oxygen, nitrogen or sulfur atom, such as fluoropropylmethyl dimethoxysilane, β-cyanoethylmethyl dimethoxysilane, 3-methacryloxypropylmethyldimethoxysilane, 3-glicydyloxypropylmethyldimethoxysilane, 3-mercaptopropyl methyldimethoxysilane and 3-aminopropylmethyldimethoxysilane. Among these, dimethyldimethoxysilane, methylphenyldimethoxysilane, diphenyldimethoxysilane and diphenylsilanediol are preferred.

An oligomer or polymer of the aforesaid siloxane compound may be preferably used. Examples of these include a 1,1,3,3-tetramethyl-1,3-dimethoxydisiloxane, 1,1,3,3-tetramethyldisiloxane-1,3-diol, 1,1,3,3,5,5-hexamethyl-1,5-dimethoxytrisiloxane, 1,3,5-triphenyl-1,3,5-trimethyl-1,5-dimethoxytrisiloxane, 1,3,5-triphenyl-1,3,5-trimethyltrisiloxane-1,5-diol, 1,1,3,3,5,5-hexaphenyl-1,5-dimethoxytrisiloxane, 1,1,3,3,5,5-hexaphenyltrisiloxane-1,5-diol, and 1,3,5-tri(trifluoropropyl)-1,3,5-trimethyltrisiloxane-1,5-diol. An oligomer or a polymer of those compounds may be used.

Alternatively, the both terminals of the thus-prepared compound represented by the formula (1-1) is capped with an alkoxy group-containing organic silicon compound to thereby prepare the compound represented by the formula (1-2). The reaction is preferably carried out in the presence of a catalyst. Examples of the organic silicon compound include trimethoxysilane, methyltrimethoxysilane, and tetramethoxysilane.

The catalyst is preferably at least one of the groups consisting of acid catalysts, basic catalysts and metal compound catalysts. The metal compound catalyst is preferably hydroxides of the elements in Group 2 of the periodic table, hydrates of hydroxides of the elements in Group 2 of the periodic table, oxides of the elements in Group 2 of the periodic table, and hydroxides and oxides of the metal elements in Groups 3-15 of the periodic table. The acid catalyst is preferably dilute hydrochloric acid and acetic acid, in particular dilute hydrochloric acid. The basic catalyst is preferably triethylamine and tetramethylammonium hydride, in particular triethylamine.

Examples of the metal compound catalysts include radium hydroxide, barium hydroxide, strontium hydroxide, calcium hydroxide, magnesium hydroxide, beryllium hydroxide, barium hydroxide, strontium hydroxide, barium oxide, strontium oxide, calcium oxide, magnesium oxide, beryllium oxide, lanthanum (III) hydroxide, cerium (IV) hydroxide, zirconium (IV) hydroxide, iron (II) hydroxide, iron (III) hydroxide, cobalt (II) hydroxide, nickel (II) hydroxide, copper (II) hydroxide, gold (III) hydroxide, zinc (II) hydroxide, cadmium (II) hydroxide, aluminum (III) hydroxide, indium (III) hydroxide, thallium (I) hydroxide, lead (II) hydroxide, bismuth (III) hydroxide, manganese (IV) oxide, iron (III) oxide and copper (II) oxide. Among these, hydroxides of elements in Group 2 of the periodic table and hydroxides of metal elements in Groups 3-15 of the periodic table are preferred in view of availability. In particular, preferred are barium hydroxide, calcium hydroxide, magnesium hydroxide, strontium hydroxide, lanthanum (III) hydroxide, aluminum (III) hydroxide, iron (II) hydroxide, iron (III) hydroxide and copper (II) hydroxide. Further, hydrates of the aforesaid hydroxides of the elements in Group 2 of the periodic table may be used. In particular, barium hydroxide octahydrate, barium hydroxide monohydrate and strontium hydroxide octahydrate are preferred.

The metal compound catalyst is preferably surface treated with a silane coupling agent before used in the condensation reaction. Any known silane coupling agents may be used. Particularly, in view of dispersibility of the catalyst, preferred are silane coupling agents which have a chemical structure similar to that of organic silicon compound to be condensed, particularly similar to that of the alkoxy group-containing organic silicon compound. Examples of the silane coupling agent include trimethoxysilane, triethoxysilane, methyltrimethoxysilane, decyltrimethoxysilane, vinyltrimethoxysilane, phenyltrimethoxysilane, styryltrimethoxysilane, 3,3,3-trifluoropropyltrimethoxysilane, 3-glicydyloxypropyldimethoxymethylsilane, 3-glicydyloxypropyltrimethoxysilane, 3-methacryloxypropyltrimethoxysilane, 3-aminopropyltrimethoxysilane, 3-mercaptopropyltrimethoxysilane, 3-chloropropyltrimethoxysilane, 1,1,3,3,5,5-hexamethoxy-1,3,5-trimethyltrisiloxane, 1,1,5,5-tetramethoxy-1,3,5-trimethyltrisiloxane-3-ol, dimethyldimethoxysilane, dimethyldiethoxysilane, phenylmethyldimethoxysilane, diphenyldimethoxysilane, distyryldimethoxysilane, dipentafluorophenyldimethoxysilane and hexamethyldisilazane. Among these, trimethoxysilane, vinyltrimethoxysilane, methyltrimethoxysilane and 3-glicydyloxypropyltrimethoxysilane are preferred.

The surface treatment of the metal compound catalyst with the silane coupling agent may be conducted in any conventional manner. For instance, a wet process and a dry process are utilizable. A ratio of the metal compound to the silane coupling agent is not particularly limited. However, in order not to damage the catalyst activity, the amount of the silane coupling agent is 0.001 to 10 parts by mass, further preferably 0.01 to 5 parts by mass, relative to 100 parts by mass of the metal compound catalyst.

An amount of the catalyst may be such that the condensation reaction proceeds sufficiently. For instance, the amount of the acid catalyst is preferably 0.1 to 10% by weight, further preferably 0.5 to 5% by weight, relative to a total weight of the organic silicon compound (s) to be subjected to the condensation reaction and the acid catalyst. In the case of the metal compound catalyst, the amount is preferably 0.01 to 20% by weight, further preferably 0.1 to 10% by weight, further preferably 0.2 to 9% by weight, more preferably 0.5 to 5% by weight, relative to a total weight of the organic silicon compound (s) to be subjected to the condensation reaction and the metal compound catalyst. As long as the amount of the catalyst is in the aforementioned range, a sufficient catalytic effect for the condensation reaction is attained.

The condensation reaction in the present invention may be carried out in the presence of at least one solvent. The solvent is used to control a reaction rate and a conversion, or used as a diluent for a condensate obtained. The solvent may be one or more selected from non-polar solvents and polar solvents. Examples of the non-polar solvents include hydrocarbons such as n-hexane, n-heptane and isooctane; aromatic hydrocarbons such as toluene and xylene. Examples of the polar solvents include water; alcohols such as methanol, ethanol and isopropanol; alcohol esters; ketones such as acetone, methylethylketone and cyclohexanone; ethers such as diethyl ether and dibutyl ether; esters such as ethyl acetate, isopropyl acetate and butyl acetate; cyano group-substituted hydrocarbons such as acetonitrile; amines; amides such as acetamide; halogenated hydrocarbons such as methylene chloride, chloroform and hexafluoromethaxylene; and sulfur-containing compounds such as dimethylsulfoxide. An amount of the solvent is not particularly limited and may properly be controlled. Generally, the amount is such that a concentration of the organic silicon compound(s) to be condensated is 5 to 95 mass %, preferably 20 to 80 mass %. The condensation reaction may also be conducted without any solvent.

(B) Organopolysiloxane Having a Network Structure

The present composition may further comprise an organopolysiloxane having a network structure. The organopolysiloxane is represented by the following formula (2):

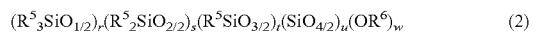

$(R^5{}_3SiO_{1/2})_r(R^5{}_2SiO_{2/2})_s(R^5SiO_{3/2})_t(SiO_{4/2})_u(OR^6)_w$ (2)

wherein $R^5$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^6$ is a hydrogen atom or a saturated hydrocarbon group having 1 to 6 carbon atoms, r is an integer of from 0 to 100, s is an integer of from 0 to 300, t is an integer of from 0 to 200, u is an integer of from 0 to 200, and w is an integer of from 1 to 50, provided that a total of t and u is 1 to 400 and a total of r, s, t and u is 2 to 800.

$R^5$ is, independently of each other, a substituted or unsubstituted, saturated hydrocarbon group having 1 to 12 carbon atoms, preferably 1 to 8 carbon atoms or a substituted or unsubstituted, aromatic hydrocarbon group having 6 to 12 carbon atoms, preferably 6 to 10 carbon atoms. Examples of the saturated hydrocarbon group include alkyl groups such as a methyl group, an ethyl group, a propyl group, a butyl group, and an octyl group, and cycloalkyl groups such as a cyclopentyl group and a cyclohexyl group; and those wherein a part or all of the hydrogen atoms bonded to the carbon atoms are substituted with a substituent such as a halogen atom such as a fluorine atom, a bromine atom and a chlorine atom, a cyano group, a glycidoxy group, a methacryloyloxy group, a mercapto group or an amino group, e.g., halogen-substituted monovalent hydrocarbon groups such as trifluoropropyl and chloropropyl groups, cyanoalkyl groups such as a β-cyanoethyl group and a γ-cyanopropyl group, 3-methacryloxypropyl group, 3-glycidyloxypropyl group, 3-mercaptopropyl group, and 3-aminopropyl group. Among these, a methyl group and a cyclohexyl group are preferred. A methyl group is more preferred. Examples of the aromatic hydrocarbon group include aryl groups such as a phenyl group, a tolyl group and a naphthyl group, and aralkyl groups such as a benzyl group, a phenylethyl group and a phenylpropyl group. Among these, a phenyl group and a tolyl group are preferred. A phenyl group is more preferred.

$R^6$ is a hydrogen atom or a saturated hydrocarbon group having 1 to 6 carbon atoms. Examples of the saturated hydrocarbon group include alkyl groups such as a methyl group, an ethyl group, a propyl group, an isopropyl group, an n-butyl group, an isobutyl group, a pentyl group, a hexyl group and a cyclohexyl group. Among these, a hydrogen atom, a methyl group, and an ethyl group are preferred in view of reactivity.

r is an integer of from 0 to 100, preferably an integer of from 0 to 75, further preferably an integer of from 1 to 50. s is an integer of from 0 to 300, preferably an integer of from 0 to 200, further preferably an integer of from 0 to 100. t is an integer of from 0 to 200, preferably an integer of from 0 to 100, further preferably an integer of from 1 to 50. u is an integer of from 0 to 200, preferably an integer of from 0 to 100, further preferably an integer of from 1 to 50. w is an integer of from 1 to 50, preferably an integer of from 2 to 30, further preferably an integer of from 3 to 20. A total of t and u is 1 to 400, preferably 1 to 200, further preferably 1 to 100. A total of r, s, t and u is 2 to 800, preferably 2 to 400, further preferably 2 to 200.

In the aforesaid branched organopolysiloxane, at least one of the groups represented by $R^5$ is preferably an aromatic hydrocarbon group. In particular, the branched organopolysiloxane has a monovalent aromatic hydrocarbon group bonded to a silicon atom, preferably in an amount of 3% or more in number, further preferably 5% or more in number, based on a total number of the groups each bonded to a silicon atom. The upper limit of the amount is preferably 80% in number. When the branched organopolysiloxane has the aromatic hydrocarbon group in the aforesaid amount, the cured product has a higher refraction index and a lower gas permeability and component (B) is well compatibile with component (A), so that the cured product has an excellent transparency. Therefore, the composition is suitable as materials for semiconductor elements.

The organopolysiloxane (B) may be prepared in any known manner. Examples of a starting organic silicon compound for component (B) include an organic silicon compound having a hydrocarbon group which may contain a halogen, oxygen, nitrogen or sulfur atom, such as, trimethylchlorosilane, dimethyldichlorosilane, methyltrichlorosilane, triphenylchlorosilane, diphenylmethylchlorosilane, phenyldimethylchlorosilane, phenylmethyldichlorosilane, diphenyldichlorosilane, phenyltrichlorosilane, tetrachlorosilane, triethylchlorosilane, diethyldichlorosilane, ethyltrichlorosilane, cyclohexylmethyldichlorosilane and cyclohexyltrichlorosilane, and alkoxy or silanol derivatives of these, trifluoropropyltrimethoxysilane, β-cyanoethyltrimethoxysilane, 3-methacryloxypropyltrimethoxysilane, 3-glycidyloxypropyltrimethoxysilane, 3-mercaptopropyltrimethoxysilane, and 3-aminopropyltrimethoxysilane.

An amount of component (B) is 5 to 900 parts by mass, preferably 10 to 900 parts by mass, further preferably 50 to 850 parts by mass, further preferably 100 to 830 parts by mass, relative to 100 parts by mass of component (A). When component (A) is an organopolysiloxane represented by the aforesaid formula (1-1) or when component (A) is the organopolysiloxane represented by the aforesaid formula (1-2) and all of k are 1, the organopolysiloxane has only one —$OR^2$ group at each terminal. In this case, the present silicone composition preferably comprises component (B) together with component (A). The amount of component (B) is as described above. On account of component (B), properties of a product obtained by curing the composition is improved. When component (A) is the organopolysiloxane represented by the aforesaid formula (1-2) and at least one of k is 2 or 3, or in particular both k at the terminals are 2 or 3, the organopolysiloxane has two or three —$OR^2$ groups at each terminal. In this case, the present silicone composition may not comprise component (B) having a network structure. That is, the amount of component (B) may be zero part by mass.

(C) Condensation Catalyst

Any known condensation catalyst may be used as long as it accelerates the condensation of component (A) or component (A) with the optional component (B). Examples of the condensation catalyst include catalysts containing a metal such as tin, lead, antimony, iron, cadmium, barium, manganese, zinc, chrome, cobalt, nickel, aluminum, magnesium, hafnium, gallium, germanium, or zirconium. These metals may be alkoxylated, esterified or chelated. For instance, organic tin catalysts such as alkyltin ester compounds, e.g., dibutyltin dioctoate, dibutyltin diacetate, dibutyltin dimaleate, dibutyltin dilaurate, and butyltin 2-ethylhexanoate; and 2-ethylhexanoate of iron, cobalt, manganese, lead, or zinc; and aluminum chelates such as aluminum bis(ethylacetoacetate)monoacetylacetonate.

A titanate and/or zirconate catalyst may also be preferably used as a condensation catalyst. The titanate catalyst may include a compound represented by the general formula $Ti(OR)_4$, wherein R is, independently of each other, a primary, secondary or tertiary monovalent aliphatic hydrocarbon group having 1 to 10 carbon atoms. The aliphatic hydrocarbon group may be linear or branched and may optionally have an unsaturated bond. Examples of R include a methyl group, an ethyl group, a propyl group, an isopropyl group, a butyl group, a tertiary alkyl group such as a tertiary butyl group and a branched secondary alkyl group such as 2,4-dimethyl-3-pentyl group, but not limited to these. Preferred is that all of R are an isopropyl group, a branched secondary alkyl group or a tertiary alkyl group, particularly a tertiary butyl group. The titanate catalyst and the zirconate catalyst may be chelated. A chelating agent is preferably an alkyl acetonate such as methyl- or ethyl-acetylacetonate.

An amount of component (C) may be a catalytic amount and not particularly limited. The catalytic amount is such that the condensation is accelerated and may be properly decided depending on a desired curing rate. For instance, the amount is preferably 0.1 to 3 parts by mass, relative to total 100 parts by mass of components (A) and (B).

The present silicone composition may further comprises other additives such as a fluorescent material, an inorganic filler, an adhesion-imparting agent, and a cure inhibitor in addition to components (A) to (C), if needed. Each of component (C) will be explained below in detail.

Fluorescent Material

Any conventional fluorescent material may be used and not particularly limited. For instance, preferred is such that absorbs light generated by a semiconductor light-emitting diode having, as a light emitting layer, a semiconductor element, in particular a nitride semiconductor element, and converts its wavelength to different one. The fluorescent material is preferably selected from, for instance, the group consisting of nitride fluorescent materials and oxynitride fluorescent materials which are activated mainly by lanthanide elements such as Eu and Ce; fluorescent materials activated mainly by lanthanide elements such as Eu or by transition metal elements such as Mn, such as alkaline earth metal halogen apatites, alkaline earth metal halogen borates, alkaline earth metal aluminates, alkaline earth metal silicates, alkaline earth metal sulfides, alkaline earth metal thiogallates, alkaline earth metal silicon nitrides and germinates; rare earth metal aluminates and rare earth metal silicates which are activated mainly by lanthanide elements such as Ce; organic fluorescent materials and organic complex fluorescent materials which are activated mainly by lanthanide elements such as Eu; and Ca—Al—Si—O—N type oxynitride glass fluorescent materials.

Examples of the nitride fluorescent material which is activated mainly by lanthanide elements such as Eu and Ce include $M_2Si_5N_8$:Eu, $MSi_7N_{10}$:Eu, $M_{1.8}Si_5O_{0.2}N_8$:Eu and $M_{0.9}Si_7O_{0.1}N_{10}$:Eu, wherein M is at least one selected from the group consisting of Sr, Ca, Ba, Mg and Zn.

Examples of the oxynitride fluorescent material which is activated mainly by lanthanide elements such as Eu and Ce include $MSi_2O_2N_2$:Eu, wherein M is at least one selected from the group consisting of Sr, Ca, Ba, Mg and Zn.

Examples of the alkaline earth metal halogen apatite fluorescent material which is activated mainly by lanthanide elements such as Eu or transition metal elements such as Mn include $M_5(PO_4)_3X$:R, wherein M is at least one selected from the group consisting of Sr, Ca, Ba, Mg and Zn, X is at least one selected from the group consisting of F, Cl, Br and I, and R is at least one of Eu and Mn.

Examples of the alkaline earth metal halogen borate fluorescent material include $M_2B_5O_9X$:R, wherein M is at least one selected from the group consisting of Sr, Ca, Ba, Mg and Zn, X is at least one selected from the group consisting of F, Cl, Br and I, and R is at least one of Eu and Mn.

Examples of the alkaline earth metal aluminate fluorescent material include $SrAl_2O_4$:R, $Sr_4Al_4O_{25}$:R, $CaAl_2O_4$:R, $BaMg_2Al_{16}O_{27}$:R, $BaMg_2Al_{16}O_{12}$:R and $BaMgAl_{16}O_{17}$:R, wherein R is at least one of Eu and Mn.

Examples of the alkaline earth metal sulfide fluorescent material include $La_2O_2S$:Eu, $Y_2O_2S$:Eu and $Gd_2O_2S$:Eu.

Examples of the rare earth metal aluminate fluorescent material which is activated mainly by lanthanide elements such as Ce include YAG type fluorescent materials represented by compositional formulas: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(Al,Ga)_5O_{12}$ and those compounds where a part or the whole of Y are replaced with Tb or Lu, such as $Tb_3Al_5O_{12}$:Ce and $Lu_3Al_5O_{12}$:Ce.

Examples of the other fluorescent materials include ZnS:Eu, $Zn_2GeO_4$:Mn and $MGa_2S_4$:Eu, wherein M is at least one selected from the group consisting of Sr, Ca, Ba, Mg and Zn, and X is at least one selected from the group consisting of F, Cl, Br and I.

The afore-mentioned fluorescent materials may comprise at least one selected from the group consisting of Tb, Cu, Ag, Au, Cr, Nd, Dy, Co, Ni and Ti, in place of Eu or in addition to Eu, if needed.

The Ca—Al—Si—O—N type oxynitride glass fluorescent material comprises, as a matrix, oxynitride glass comprising 20 to 50 mole % of $CaCO_3$, calculated as CaO, 0 to 30 mole % of $Al_2O_3$, 25 to 60 mole % of SiO, 5 to 50 mole % of AlN and 0.1 to 20 mole % of rare earth metal oxides or transition metal oxides, wherein the total amount of the aforesaid components is 100 mole %. The fluorescent material with the oxynitride glass matrix preferably comprises nitrogen atoms in an amount of 15 weight % or less and preferably comprises, besides rare earth metal oxides ions, the other rare earth metal ions which work as a sensitizer in an amount of 0.1 to 10 mole %, calculated as rare earth metal oxides, in the fluorescent glass as a co-activator.

Other fluorescent materials which have a similar function and provide similar effects may be used.

An amount of the fluorescent material is preferably 0.1 to 2,000 parts by mass, more preferably 0.1 to 100 parts by mass, relative to 100 parts by mass of the components other than the fluorescent material, for instance, 100 parts by mass of components (A) to (C). When the present cured product is used as a wavelength conversion film comprising a fluorescent material, the amount of the fluorescent material is preferably 10 to 2,000 parts by mass. The fluorescent material preferably has a mean diameter of 10 nm or more, more preferably 10 nm to 10 µm, further preferably 10 nm to 1 µm. The mean diameter is determined from a particle size distribution obtained in a laser diffraction method using a Cilas laser measurement instrument.

Inorganic Filler

Examples of the inorganic filler include silica, fumed silica, fumed titanium dioxide, alumina, calcium carbonate, calcium silicate, titanium dioxide, iron (III) oxide and zinc oxide. The inorganic filler may be used singly or in combination of two or more of them. An amount of the inorganic filler may be 20 parts by mass or less, preferably 0.1 to 10 parts by mass, relative to total 100 parts by mass of components (A) and (B), but not limited to these.

Adhesion-imparting Agent

The present silicone composition may comprise an adhesion-imparting agent in order to add adhesiveness to a cured product, if needed. Examples of the adhesion-imparting agent include organosiloxane oligomers having at least two, preferably three, functional groups selected from the group consisting of a hydrogen atom bonded to a silicon atom, an alkenyl group, an alkoxy group and an epoxy group. The organosiloxane oligomer preferably has 4 to 50 silicon atoms, more preferably 4 to 20 silicon atoms. The adhesion-imparting agent may be organooxysilyl-modified isocyanurate represented by the following general formula (7) or a hydrolysis and condensation product of the compound, i.e. organosiloxane-modified isocyanurate.

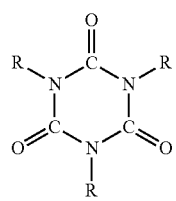

(7)

wherein R is, independently of each other, an organic group represented by the following formula (8) or an unsaturated aliphatic hydrocarbon group which may comprise an oxygen atom, provided that at least one of R is the group represented by the formula (8).

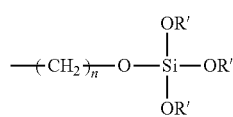

(8)

wherein R' is a hydrogen atom or a monovalent hydrocarbon group having 1 to 6 carbon atoms and n is an integer of from 1 to 6, preferably 1 to 4. The unsaturated aliphatic hydrocarbon group is preferably a linear or branched alkenyl group having 2 to 8 carbon atoms, further preferably 2 to 6 carbon atoms, such as a vinyl group, an allyl group, a 1-butenyl group, a 1-hexenyl group, a 2-methylpropenyl group and a (meth)acryl group.

An amount of the adhesion-imparting agent is 10 parts by mass or less, preferably 0.1 to 8 parts by mass, more preferably 0.2 to 5 parts by mass, relative to total 100 parts by mass of components (A) and (B). When the amount of the adhesion-imparting agent does not exceed the aforesaid upper limit, high hardness of the cured product is attained and surface tackiness of the cured product is avoided.

Other Additives

The present silicone composition may comprise other additives besides the aforesaid components. Examples of the other additives include anti-aging agents, radical polymerization inhibitors, flame retardants, surfactants, antiozonants, light stabilizers, thickeners, plasticizers, antioxidants, heat stabilizers, electrical conductivity-imparting agents, antistatic agents, radiation insulating agents, nucleating agents, phosphorus-type peroxide decomposers, lubricants, pigments, metal-inactivating agents, physical property-adjusting agents and organic solvents. These optional components may be used singly or in combination of two or more of them.

The simplest embodiment of the present silicone composition consists of component (A), optionally component (B) and component (C). Preferably, the composition consists of components (A), optionally component (B), component (C) and the fluorescent material. In particular, it is preferred that the composition does not comprise any inorganic filler such as silica, in order to prepare a cured product having a higher transparency. The inorganic filler is as described above.

The present silicone composition may be prepared in any known manners which are not limited to any particular one. For instance, the composition may be prepared by mixing component (A), optionally component (B), component (C) and the other components in any manners. For instance, the aforesaid components are placed in a commercial stirrer, such as THINKY CONDITIONING MIXER, ex Thinky Corporation, and mixed homogeneously for about 1 to 5 minutes to prepare the present silicone composition.

The present silicone composition may be cured in any known manners. Curing conditions are not particularly limited. For instance, the composition may be cured at 60 to 200 degrees C. for 1 to 48 hours. In particular, the composition is cured stepwise in the range of 60 to 200 degrees C. The stepwise curing preferably consists of the following two steps. The silicone composition is first heated at 60 to 100 degrees C. for 0.5 to 4 hours to be defoamed sufficiently. Subsequently, the composition is heated at 120 to 200 degrees C. for 1 to 48 hours to cure. Through these steps, the composition is sufficiently cured, no bubble occur and the cured product is colorless and transparent, even when a cured product has a large thickness. In the present specification, "colorless and transparent" means that a light transmittance at 450 nm of a cured product having a thickness of 1 mm is 80% or more, preferably 85% or more, particularly preferably 90% or more.

The silicone composition provides a cured product having a high optical transparency. Accordingly, the present silicone composition is useful as an encapsulating material for LED elements, in particular blue LED elements and violet LED elements. The encapsulation of LED elements with the present silicone composition may be carried out in any known manners. For instance, a dispense method and a compression molding method may be used.

On account of the properties such as excellent crack resistance, heat resistance, light resistance and transparency, the present silicone composition and cured product are useful also as materials for displays, optical recording mediums, optical apparatus, optical components and optical fibers, and photo/electron functional organic materials and materials for integrated semiconductor circuit-related elements.

EXAMPLES

The present invention will be explained below in further detail with reference to a series of the Examples and the Comparative Examples, though the present invention is in no way limited by these Examples.

In the following descriptions, $^{29}$Si-NMR determination was conducted with RESONANCE500, ex JEOL Ltd. The weight average molecular weight (Mw) was determined by gel permeation chromatography, i.e., GPC, and reduced to polystyrene. Conditions in the GPC were as follows.

[GPC conditions]
Solvent: Tetrahydrofuran
Flow rate: 0.6 mL/min.
Columns: all provided by TOSOH Cop.
TSK Guardcolumn SuperH-L
TSKgel SuperH4000 (6.0 mmI.D.×15 cm×1)
TSKgel SuperH3000 (6.0 mmI.D.×15 cm×1)
TSKgel SuperH2000 (6.0 mmI.D.×15 cm×2)
Column Temperature: 40 degrees C.
Injection Volume: 20 micro liters of a 0.5% by weight solution in THF.
Detector: Differential refractive index detector (RI)

Synthesis Example 1

Synthesis of Branched Organopolysiloxane (A-1)

63.7 Grams (0.2 mol) of 1,1-diphenyl-1,3-dimethyl-3,3-dimethoxysiloxane and 1198.5 grams (2.23 mols) of polymethylphenylsiloxane-ω,ω-diol, Mw=537.43, were mixed with stirring and heated to 60 degrees C. 2.0 Grams of $Sr(OH)_2 \cdot 8H_2O$ were added to the mixture and, then, these compounds were reacted for 3 hours. The catalyst was removed from the reaction mixture by filtration and, then, methanol and water were distilled at a reduced pressure to obtain an oily branched organopolysiloxane represented by the following formula. Mw was 6,332. The organopolysiloxane was analyzed by $^{29}$Si-NMR to find that n is 42 and m is 1.3, both on average.

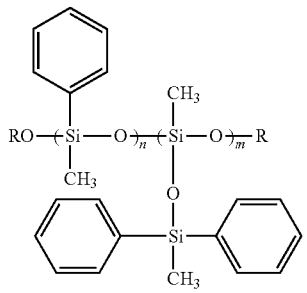

wherein R is $CH_3$ or a hydrogen atom.

Synthesis Example 2

Synthesis of Branched Organopolysiloxane (A-2)

524.1 Grams (1 mol) of 1,1,3,3,-tetraphenyl-1,5-dimethyl-5,5-dimethoxytrisiloxane and 1381.2 grams (2.57 mols) of polymethylphenylsiloxane-ω,ω-diol, Mw=537.43, were mixed and heated to 80 degrees C. with stirring. 12 Grams of $Sr(OH)_2 \cdot 8H_2O$ were added to the mixture and, then, these compounds were reacted at 80 degrees C. for 12 hours, while distilling off generated methanol. The catalyst was removed from the reaction mixture by filtration and, then, methanol and water were distilled at a reduced pressure to obtain an oily branched organopolysiloxane represented by the following formula. Mw was 10,416. The organopolysiloxane was analyzed by $^{29}$Si-NMR to find that n is 54 and m is 5.8, both on average.

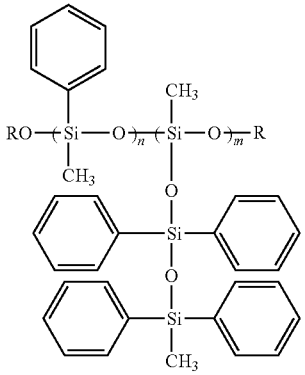

wherein R is $CH_3$ or a hydrogen atom.

Synthesis Example 3

Synthesis of Branched Organopolysiloxane (A-3)

142.6 Grams of water was added to 955.5 grams (3 mols) of 1,1-diphenyl-1,3-dimethyl-3,3-dimethoxydisiloxane and, then, 12 grams of $Sr(OH)_2 \cdot 8H_2O$ were added thereto with stirring. Then, the reaction was conducted at 80 degrees C. for 12 hours, while distilling off generated methanol. The catalyst was removed from the reaction mixture by filtration and, then, methanol and water were distilled at a reduced pressure to obtain an oily branched organopolysiloxane represented by the following formula. Mw was 4302. The organopolysiloxane was analyzed by $^{29}$Si-NMR to find that m is 15, on average.

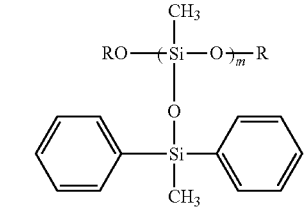

wherein R is $CH_3$ or a hydrogen atom.

Synthesis Example 4

Synthesis of Branched Organopolysiloxane (A-4)

63.7 Grams (0.2 mol) of 1,1-diphenyl-1,3-dimethyl-3,3-dimethoxydisiloxane and 1198.5 grams (2.23 mols) of polymethylphenylsiloxane-ω,ω-diol, Mw=537.43, were mixed with stirring and heated to 80 degrees C. 4.0 Grams of $Sr(OH)_2 \cdot 8H_2O$ were added to the mixture and, then, these compounds were reacted for 3 hours, while distilling off generated methanol. 152.2 Grams (1.0 mol) of tetramethoxysilane were added to the reaction product and reacted for further 12 hours. The catalyst was removed from the reaction mixture by filtration and, then, methanol, water and unreacted tetramethoxysilane were distilled at a reduced pressure to obtain an oily branched organopolysiloxane represented by the following formula. Mw was 7,849. The organopolysiloxane was analyzed by $^{29}$Si-NMR to find that n is 50 and m is 1.6, both on average.

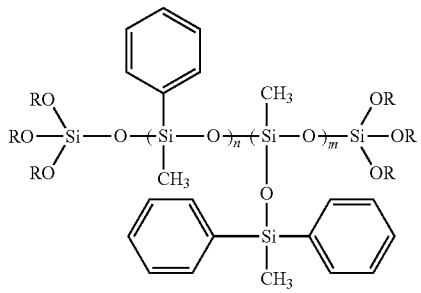

wherein R is $CH_3$.

Synthesis Example 5

Synthesis of Branched Organopolysiloxane (A-5)

127.4 Grams (0.4 mol) of 1,1-diphenyl-1,3-dimethyl-3,3-dimethoxydisiloxane and 749.0 grams (0.5 mol) of polydimethylsiloxane-ω,ω-diol, Mw=1498, were mixed and heated to 80 degrees C. with stirring. 12 Grams of $Sr(OH)_2 \cdot 8H_2O$ were added to the mixture and, then, these compounds were reacted at 80 degrees C. for 12 hours, while distilling off generated methanol. The catalyst was removed from the reaction mixture by filtration and, then, methanol and water were distilled at a reduced pressure to obtain an oily branched organopolysiloxane represented by the following formula. Mw was 10,129. The organopolysiloxane was analyzed by $^{29}$Si-NMR to find that n is 116 and m is 4.7, both on average.

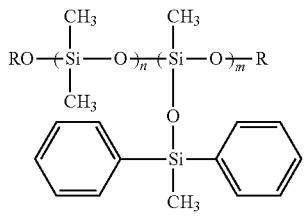

wherein R is $CH_3$ or a hydrogen atom.

Synthesis Example 6

Synthesis of Branched Organopolysiloxane (A-6)

194.4 Grams (1 mol) of 1,1,1,3-tetramethyl-3,3-dimethoxydisiloxane and 749.0 grams (0.5 mol) of polydimethylsiloxane-ω,ω-diol, Mw-1498, were mixed and heated to 80 degrees C. with stirring. 12 Grams of $Sr(OH)_2 \cdot 8H_2O$ were added to the mixture and, then, these compounds were reacted at 80 degrees C. for 12 hours, while distilling off generated methanol. The catalyst was removed from the reaction mixture by filtration and, then, methanol and water were distilled at a reduced pressure to obtain an oily branched organopolysiloxane represented by the following formula. Mw was 21,008. The organopolysiloxane was analyzed by $^{29}$Si-NMR to find that n is 230 and m is 26, both on average.

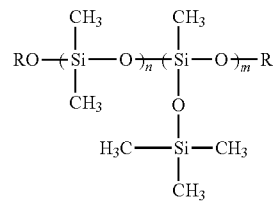

wherein R is $CH_3$ or a hydrogen atom.

Comparative Synthesis Example 7

Synthesis of Branched Organopolysiloxane (A'-7) for Comparative

Example

1483 Grams (5 mols) of octamethylcyclotetrasiloxane, 272.5 grams (2 mols) of trimethoxysilane, 8.9 g of potassium hydroxide and 119 g of water were mixed and, then, reacted at 80 degrees C. for 8 hours, while distilling off generated methanol. The reaction mixture was transferred to an autoclave, and further allowed to react in a closed state at 140 degrees C. for 12 hours. Then, the reaction mixture was cooled to 80 degrees C. and neutralized with 10.1 g of acetic acid. The reaction mixture was washed with water and subjected to distillation at a reduced pressure to obtain an oily branched organopolysiloxane represented by the following formula. Mw was 17,657. The organopolysiloxane was analyzed by $^{29}$Si-NMR to find that n is 108, n' is 108 and m is 19, all on average.

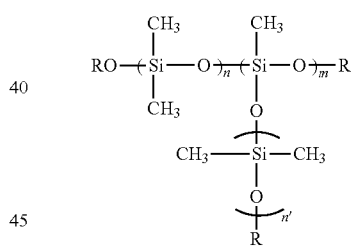

wherein R is $CH_3$ or a hydrogen atom.

In addition, the following organopolysiloxanes (A'-8), (A'-9) and (A'-10) were used in the Comparative Examples.

(A'-8) Linear organopolysiloxane represented by the following formula, ex Shin-Etsu Chemical Co., Ltd.:

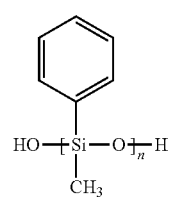

wherein n is 41 on average.

(A'-9) Linear organopolysiloxane represented by the following formula, ex Shin-Etsu Chemical Co., Ltd.:

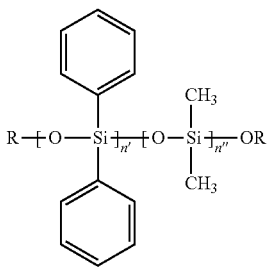

wherein n' is 5 and n" is 105 both on average, and R is CH$_3$ or a hydrogen atom.

(A'-10) Linear organopolysiloxane represented by the following formula, ex Shin-Etsu Chemical Co., Ltd.:

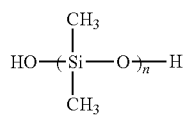

wherein n is 250 on average.

Components (B) and (C) used in the Examples and the Comparative Examples are as follows.

(B-1) Methylphenyl silicone resin represented by the following formula with M units and T units, which has 1.5 wt % of an SiOH group and 3.0 wt % of an SiOCH$_3$ group and is available as a 50 wt % solution in xylene, ex Shin-Etsu Chemical Co., Ltd.:

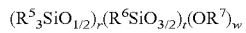

wherein $R^5$ is a methyl group, $R^6$ is a phenyl group, $R^7$ is a hydrogen atom or a methyl group, the weight average molecular weight is 3505, r/(r+t)=0.25 and t/(r+t)=0.75. w is a number such that the total amount of the SiOH group and the SiOCH$_3$ group is 4.5 wt %.

(B-2) Methyl silicone resin represented by the following formula with M units and Q units, which has 1.2 wt % of an SiOH group and is available as 60 wt % solution in toluene, ex Shin-Etsu Chemical Co., Ltd.:

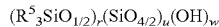

wherein $R^5$ is a methyl group, the weight average molecular weight is 6082, r/(r+u)=0.43 and u/(r+u)=0.57. w is a number such that the amount of the SiOH group is 1.2 wt %.

(C) Condensation catalyst: Alumichelate D, aluminum bis(ethylacetoacetate)monoacetylacetonate, ex Kawaken Fine Chemicals Co., Ltd.

Example 1

Mixed were 100 parts by mass of component (A-1) and 250 parts by mass, as a solid content, of component (B-1). Then, the solvent was distilled at a reduced pressure. The mixture was sufficiently cooled to near room temperature. The condensation catalyst (C) was added and mixed in an amount of 0.1 part by mass, relative to total 100 parts by mass of components (A-1) and (B-1) to prepare a silicone composition.

Examples 2 to 6 and Comparative Examples 1 to 4

The procedures in Example 1 were repeated, except that the components and their amounts were changed as described in Tables 1 and 2. In all of the compositions, the amount of the condensation catalyst (C) was 0.1 part by mass, relative to total 100 parts by mass of the oraganopolysiloxane and the silicone resin.

The silicone compositions prepared in Examples 1 to 6 and Comparative Examples 1 to 4 were evaluated according to the following manners.

[1. Hardness of the Cured Products]

The silicone composition was poured into an aluminum perti dish having a diameter of 50 mm and a depth of 10 mm and, then, heated at 60 degrees C. for one hour, 100 degrees C. for one hour and, subsequently 150 degrees C. for 12 hours to obtain a cured product. A hardness of the cured product was determined with durometer type A or D according to the Japanese Industrial Standards(JIS) K 6253-3: 2012. The results are as shown in Tables 1 and 2.

[2. Light Transmittance of the Cured Products]

A concave Teflon spacer having a depth of 1 mm was sandwiched by two glass slides having dimensions of 50 mm×20 mm×1 mm and tightly held. The silicone composition was poured into the Teflon spacer and cured stepwise at 60 degrees C. for one hour, 100 degrees C. for one hour and, subsequently 150 degrees C. for 12 hours to cure, to obtain a sample. A transmittance at 450 nm of the sample was determined with a spectrophotometer, U-4100, ex Hitachi High-Technologies Corporation. The results are as shown in Tables 1 and 2.

[3. Light Resistance of the Cured Products]

The cured product prepared in the aforesaid light transmittance test procedures was irradiated at 120 degrees C. for 1,000 hours with a laser light having a wavelength of 440 nm and a power of 250 mW/mm$^2$ with a laser irradiation equipment having a temperature control function, wherein a light source was UV-LED manufactured by Nichia Corporation, an oven was ESPEC STH-120, and a detector was ADVANTEST R8240. A percentage transmittance after the irradiation was calculated, based on the initial transmittance at 0 hour. The results are as shown in Tables 1 and 2.

[4. Glass-transition Temperature of the Cured Products]

The silicone composition was poured into a Teflon-coated mold having a cavity of 150 mm×200 mm×2 mm, and cured stepwise at 60 degrees C. for one hour, 100 degrees C. for one hour and, subsequently 150 degrees C. for 12 hours to obtain a cured product. The storage elastic modulus, MPa, of the cured product was determined at a temperature between −140 degrees C. and 150 degrees C. with DMA Q800, ex TA Instruments. An temperature at a peak in a curve of tangent δs, calculated from the obtained storage elastic modulus vs temperature is a glass transition temperature (Tg). The storage elastic modulus was determined in the following conditions: the sample had a length of 20 mm, a width of 5 mm and a thickness of 1 mm, a rate of temperature rise was 5° C./minute; and a multi-frequency mode, a tension mode, and an amplitude of 15 μm. The results are as shown in Tables 1 and 2.

[5. Thermal Cycle Test]

The silicone composition was dispensed on a Tiger3528 package, ex Shin-Etsu Chemical Co., Ltd., and cured stepwise at 60 degrees C. for one hour, 100 degrees C. for one hour and, subsequently 150 degrees C. for 12 hours to cure, to obtain 20 sample packages encapsulated with the cured product. The 20 samples were subjected to a thermal cycle test (TCT) with 1000 thermal cycles of −50 to 140 degrees C. and vice-versa. The number of the test samples which had cracks was counted. The results are as shown in Tables 1 and 2.

TABLE 1

|  |  |  |  | Ex. 1 | Ex. 2 | Ex. 3 | Ex. 4 | Ex. 5 | Ex. 6 |
|---|---|---|---|---|---|---|---|---|---|
| Component (A) | (A-1) |  |  | 100 | — | — | — | — | — |
|  | (A-2) |  |  | — | 100 | — | — | — | — |
|  | (A-3) |  |  | — | — | 100 | — | — | — |
|  | (A-4) |  |  | — | — | — | 100 | — | — |
|  | (A-5) |  |  | — | — | — | — | 100 | — |
|  | (A-6) |  |  | — | — | — | — | — | 100 |
| Component (B) | (B-1) |  |  | 200 | 10 | 800 | — | — | — |
|  | (B-2) |  |  | — | — | — | — | 100 | 100 |
| Evaluation | Hardness | Type A | — | — | — | 41 | — | 15 | 62 | 79 |
|  |  | Shore D | — | — | 25 | — | 48 | — | — | — |
|  | Transmittance | Thickness of 1 mm, 450 nm | % T | 99.6 | 99.5 | 99.4 | 99.5 | 99.7 | 99.8 |
|  | Light resistance | 120 degrees C., 440 nm, 1000 hr | % T | 98.2 | 98.4 | 97.5 | 98.8 | 99.1 | 99.1 |
|  | Glass-transition temperature | By DMA | ° C. | 20 | 14 | 22 | 7 | −105 | −121 |
|  | Thermal cycle test | 1000 thermal cycles of −50 to/from 140 degrees C. | Number of the cracked samples | 0/20 | 0/20 | 0/20 | 0/20 | 0/20 | 0/20 |

TABLE 2

|  |  |  |  | Comparative Example 1 | Comparative Example 2 | Comparative Example 3 | Comparative Example 4 |
|---|---|---|---|---|---|---|---|
| Comparative organopolysiloxane | (A'-7) |  |  | — | — | — | 100 |
|  | (A'-8) |  |  | 100 | — | — | — |
|  | (A'-9) |  |  | — | 100 | — | — |
|  | (A'-10) |  |  | — | — | 100 | — |
| Component (B) | (B-1) |  |  | 200 | — | — | — |
|  | (B-2) |  |  | — | 100 | 100 | 100 |
| Evaluation | Hardness | Type A | — | — | 78 | 84 | 82 |
|  |  | Shore D | — | 36 | — | — | — |
|  | Transmittance | Thickness of 1 mm, 450 nm | % T | 99.5 | 99.6 | 99.6 | 99.5 |
|  | Light resistance | 120 degrees C., 440 nm, 1000 hr | % T | 98.1 | 99 | 98.9 | 99 |
|  | Glass-transition temperature | By DMA | ° C. | 31 | −99 | −110 | −114 |
|  | Thermal cycle test | 1000 thermal cycles of −50 to/from 140 degrees C. | Number of the cracked samples | 20/20 | 18/20 | 20/20 | 16/20 |

As seen in Comparative Examples 1 to 4 in Table 2, the cured products obtained from the silicone compositions comprising the organopolysiloxane having a long branched chain or no branched chain showed to poor resistance in temperature change and causes cracks in the TCT test. In contrast, as seen in Table 1, the present silicone compositions provided a cured product showing the excellent resistance in temperature change and the excellent crack resistance. Further, as seen in Table 1, the cured products obtained from the present silicone compositions had the excellent light resistance. Additionally, in a comparison between the compositions comprising the organopolysiloxane having the similar length of the molecular chain, such as a comparison between Example 1 and Comparative Example 1, a comparison between Example 5 and Comparative Example 2, and a comparison between Example 6 and Comparative Example 3, the glass-transition temperature of the cured product obtained from the composition comprising the branched organopolysiloxane is lower, compared to that of the cured product obtained from the composition comprising the linear organopolysiloxane. The glass-transition temperatures of the cured products obtained in Examples 5 and 6 and Comparative Examples 2 to 4 are lower than those of the cured products obtained in Examples 1 to 4 and Comparative Example 1. This is because one or both of components (A) and (B) does not have an aromatic group in Examples 5 and 6 and Comparative Examples 2 to 4.

[Water Vapor Permeability of the Cured Products]

Each of the silicone compositions prepared in Examples 1 and 6 and Comparative Example 1 was poured into a Teflon-coated mold having a cavity of 150 mm×200 mm×2 mm and, then, cured stepwise at 60 degrees C. for one hour, 100 degrees C. for one hour and, subsequently 150 degrees C. for 12 hours to cure, to obtain a test sample. A water vapor permeability of the test sample was determined in a Lyssy method with L80-5000, ex Systech Instruments Ltd. according to JIS K 7129. The results are as follows.

Example 1: 16 g·m$^2$/day
Example 6: 51 g·m$^2$/day

Comparative Example 1: 16 g·m$^2$/day

Each of components (A) and (B) comprised in the compositions of Example 1 and Comparative Example 1 has the aromatic group. None of components (A) and (B) in the composition of Example 6 has an aromatic group. As seen in the aforesaid results, it is preferable that both of components (A) and (B) have an aromatic group in order to obtain a cured product having a lower gas permeability.

INDUSTRIAL APPLICABILITY

A cured product obtained from the present condensation-curable silicone composition has an excellent resistance in temperature change and an excellent crack resistance. Accordingly, a semiconductor element may be encapsulated with the cured product of the present condensation-curable silicone composition to thereby provide a semiconductor device having an excellent reliability. Further, the present condensation-curable silicone composition provides a cured product having a high light transmittance, so that the present condensation-curable silicone composition is usable as an encapsulating material for LEDs, in particular, blue LEDs and ultraviolet LEDs.

The invention claimed is:

1. A condensation-curable silicone composition comprising the following components (A), (B) and (C):
(A) a branched organopolysiloxane represented by the following formula (1-1) or (1-2);

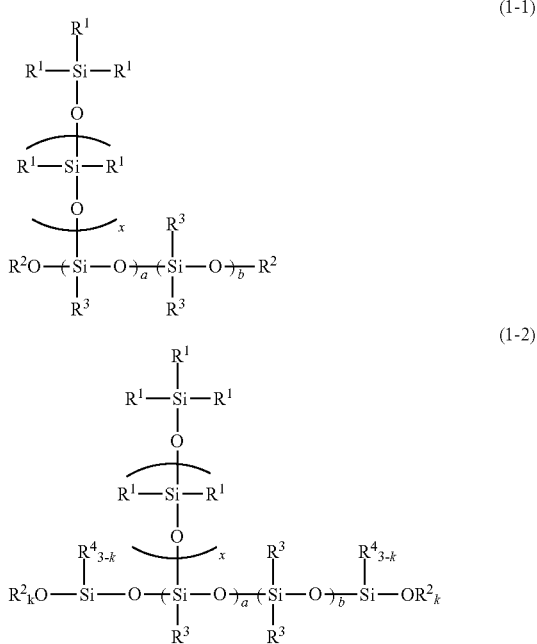

wherein $R^1$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^2$ is, independently of each other, a hydrogen atom or a saturated hydrocarbon group having 1 to 6 carbon atoms, $R^3$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^4$ is, independently of each other, a hydrogen atom, a substituted or unsubstituted, saturated hydrocarbon group having 1 to 6 carbon atoms or a substituted or unsubstituted, aromatic hydrocarbon group having 6 to 12 carbon atoms, x is an integer of from 0 to 3, a is an integer of from 1 to 100, b is an integer of from 0 to 300, and k is an integer of from 1 to 3, wherein the parenthesized siloxane units may form a block unit or bond randomly;

(B) an organopolysiloxane having a network structure and represented by the following formula (2):

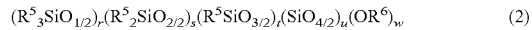

$$(R^5{}_3SiO_{1/2})_r(R^5{}_2SiO_{2/2})_s(R^5SiO_{3/2})_t(SiO_{4/2})_u(OR^6)_w \quad (2)$$

wherein $R^5$ is, independently of each other, a substituted or unsubstituted, saturated hydrocarbon group having 1 to 12 carbon atoms or a substituted or unsubstituted, aromatic hydrocarbon group having 6 to 12 carbon atoms, $R^6$ is a hydrogen atom or a saturated hydrocarbon group having 1 to 6 carbon atoms, r is an integer of from 0 to 100, s is 0, t is an integer of from 0 to 200, u is an integer of from 0 to 200, and w is an integer of from 3 to 50, provided that a total of t and u is 1 to 400 and a total of r, s, t and u is 2 to 800, in an amount of 5 to 900 parts by mass, relative to 100 parts by mass of component (A), and (C) a condensation catalyst in a catalytic amount.

2. The condensation-curable silicone composition according to claim 1, wherein x is zero.

3. The condensation-curable silicone composition according to claim 1, wherein at least one of the groups represented by $R^1$ is an aromatic hydrocarbon group having 6 to 12 carbon atoms.

4. The condensation-curable silicone composition according to claim 1, wherein (A) the branched organopolysiloxane has a monovalent aromatic hydrocarbon group bonded to a silicon atom, in an amount of 3% or more in number, based on a total number of groups each bonded to a silicon atom.

5. A semiconductor device provided with a cured product obtained by curing the condensation-curable silicone composition according claim 1.

6. The semiconductor device according to claim 5, wherein the semiconductor device has a semiconductor element which is encapsulated with said cured product.

7. The semiconductor device according to claim 6, wherein the semiconductor element is a light emitter.

8. The condensation-curable silicone composition according to claim 1, wherein the branched organopolysiloxane (A) is represented by the formula (1-1).

9. The condensation-curable silicone composition according to claim 1, wherein the branched organopolysiloxane (A) is represented by the formula (1-2).

10. The condensation-curable silicone composition according to claim 1, wherein $R^1$ is methyl or phenyl; $R^2$ is hydrogen, methyl or ethyl; $R^3$ is methyl or phenyl; a is an integer of from 1 to 50; b is an integer of from 0 to 150, provided that a total of a and b is 5 to 200; a/(a+b) is 0.01 to 1.0.

11. The condensation-curable silicone composition according to claim 10, wherein $R^4$ is hydrogen, methyl or phenyl, and the branched organopolysiloxane (A) is represented by the formula (1-2).

12. The condensation-curable silicone composition according to claim 11, wherein k is 3.

13. The condensation-curable silicone composition according to claim 1, wherein $R^5$ is methyl or phenyl; $R^6$ is hydrogen, methyl or ethyl; r is an integer of from 1 to 50, t is an integer of from 1 to 50, u is an integer of from 1 to 50, and w is an integer of from 3 to 20.

14. The condensation-curable silicone composition according to claim 13, wherein $R^5$ is phenyl.

15. The condensation-curable silicone composition according to claim 1, wherein the amount of (B) is 100 to 830 parts by mass, relative to 100 parts by mass of component (A).

* * * * *